(12) United States Patent
Riener et al.

(10) Patent No.: US 6,262,368 B1
(45) Date of Patent: Jul. 17, 2001

(54) DATA CARRIER COMPRISING AN IMPLANTED MODULE BASED ON A METAL LEAD FRAME WITH A DOUBLE-SIDED CHIP COVER

(75) Inventors: Thomas Riener; Stefan Posch, both of Graz (AT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/275,365

(22) Filed: Mar. 24, 1999

(30) Foreign Application Priority Data

Mar. 27, 1998 (EP) .................................... 98890082

(51) Int. Cl.[7] ................... H05K 5/00; H02G 3/08
(52) U.S. Cl. ..................... 174/52.1; 336/92; 336/96; 361/811
(58) Field of Search ................ 174/52.1, 52.4; 361/782, 811; 336/90, 92, 96

(56) References Cited

U.S. PATENT DOCUMENTS

| 4,996,411 | 2/1991 | Rebjock | 235/488 |
| 4,999,742 | 3/1991 | Stampfli | 361/782 |
| 5,953,213 | * 9/1999 | Napierala | 361/760 |

FOREIGN PATENT DOCUMENTS

| 0011320A2 | 5/1980 | (EP) | H01H/13/04 |
| WO9705569 | 2/1997 | (WO) | G06K/19/077 |

* cited by examiner

Primary Examiner—Dean A. Reichard
Assistant Examiner—Hung V Ngo
(74) Attorney, Agent, or Firm—Jack D. Slobod

(57) ABSTRACT

A data carrier has a chip with chip contacts, a transmission coil for contactless communication with a write/read station, a metal lead frame with a chip carrying part and contact forming parts, and a chip cover made of electrically insulating material. The transmission coil has coil contacts. The chip cover has a first cover part covering the chip at one side of the metal lead frame and a second cover part covering the other side of the metal lead frame. The second cover part has electrically conducting passages electrically connecting the coil contacts to the contact forming parts that are otherwise connected to the chip contacts. The chip carrying part and the first and second contact forming parts are electrically insulated with respect to each other and are arranged in a substantially coplanar relationship to each other.

9 Claims, 1 Drawing Sheet

DATA CARRIER COMPRISING AN IMPLANTED MODULE BASED ON A METAL LEAD FRAME WITH A DOUBLE-SIDED CHIP COVER

Data carrier comprising an implanted module based on a metal lead frame with a double-sided chip cover.

BACKGROUND OF THE INVENTION

1. Field of the Invention

The invention relates to a data carrier constructed for the contactless communication with a write/read station and comprising a carrier body and comprising a trough-shaped recess in the carrier body and including a module which has been implanted in the recess after it has been formed and which is electrically insulated with respect to the environment of the data carrier, which module comprises a carrier/contact configuration and a chip carried by the carrier/contact configuration and a chip cover of an electrically insulating material, which cover is connected to the carrier/contact configuration and covers the chip and two module contacts realized by means of the carrier/contact configuration, each module contact being electrically connected both to a chip contact of the chip and to a coil contact of a transmission coil embedded in the data carrier for the purpose of contactless communication.

2. Description of the Related Art

Such a data carrier of the type defined in the opening paragraph is known from, for example, the document WO 97/05569 A1. In the known data carrier the carrier/contact configuration of the module is manufactured with the aid of a so-called epoxy frame and comprises a continuous carrier plate of an epoxy material and two module contacts arranged on the carrier plate at its side which is remoter from the data carrier environment, which contacts each consist of a copper layer, preferably applied to the carrier plate with the aid of a printed circuit technology. Such a carrier/contact configuration is comparatively expensive, has a comparatively large overall height and has a comparatively high resistance to bending loads, which is particularly undesirable when the data carrier is a card-shaped data carrier, such as a credit card, which is often subjected to bending loads, because in that case bending loads may relatively easily give rise to interruption of the electrical connections between the module contacts and the coil contacts in the transitional area to the module contacts.

SUMMARY OF THE RELATED ART

It is an object of the invention to preclude or at least mitigate the aforementioned problems and to provide an improved data carrier. According to the invention, in order to achieve this object, a data carrier of the type defined in the opening paragraph is characterized in that the carrier/contact configuration of the implanted module has been manufactured by means of a metal lead frame and comprises two side parts and a central part which is substantially coplanar with the two side parts and is situated between the two side parts, the two side parts and the central part being electrically insulated with respect to one another and being mechanically connected to one another with the aid of the chip cover, and the two side parts forming the two module contacts and the central part carrying the chip, and the chip cover has a double-sided construction in relation to the carrier/contact configuration and comprises an outer part situated nearer the environment of the data carrier and an inner part which is remoter from the environment of the data carrier and has two passages, and a module contact and a coil contact are electrically connected via each passage by means of an electrically conductive medium.

The measures in accordance with the invention have the advantage that a carrier/contact configuration manufactured with the aid of a so-called metal lead frame and, consequently, a module thus manufactured can be used in a data carrier manufactured in accordance with the so-called implant technology. In comparison with a carrier/contact configuration manufactured with the aid of an epoxy frame such a carrier/contact configuration manufactured with the aid of a metal lead frame has the substantial advantages that, in the first place, such a carrier/contact configuration based on a metal lead frame can have a smaller overall height, in the second place, it exhibits a greater flexibility in the case of bending loads, so that even when a data carrier in accordance with the invention is subjected to comparatively large bending loads this does not result in any adverse effects on the carrier/contact configuration of the data carrier module and in interruptions between the module contacts and the coil contacts and, in the third place, it can also be manufactured at substantially lower cost. A further great advantage of such a construction in accordance with the invention is that no separate means are required to insulate the module with respect to the environment of the data carrier because the outer part of the chip cover performs this insulation function. Furthermore, the passages of the inner part of the chip cover ensure that the electrically conductive connection medium for connecting the module contacts and the coil contacts can be available only in the space defined by the passages, as a result of which the connection medium cannot cause undesired short-circuits.

A variant of the invention has the advantage that the electrical connections between the module contacts and the chip contacts, on the one hand, and the electrical connection between the module contacts and the coil contacts, on the other hand, can be provided and arranged independently of one another because they are disposed at opposite sides of the carrier/contact configuration.

A variant of the invention has the advantage that by means of the outer part of the chip cover the trough-shaped recess can be filled up completely, so that the trough-shaped recess is wholly closed by the outer part of the chip cover.

A variant of the invention has the advantage that the connection medium contained in each passage serve not only for the electrically conductive connection of the module contacts and the coil contacts but also contribute to the mechanical fastening of the module in the trough-shaped recess. It is to be noted that instead of a conductive adhesive other electrically conductive connection medium may be provided, for example an electrically conductive paste such as conductive silver paste, but also other materials.

The above-mentioned as well as further aspects of the invention will become apparent from the example of an embodiment described hereinafter and will be elucidated with reference to this example.

BRIEF DESCRIPTION OF THE INVENTION

The invention will now be described in more detail with reference to the drawings, which show an example of an embodiment to which the invention is not limited.

DETAILED DESCRIPTION OF THE INVENTION

Figure 1:
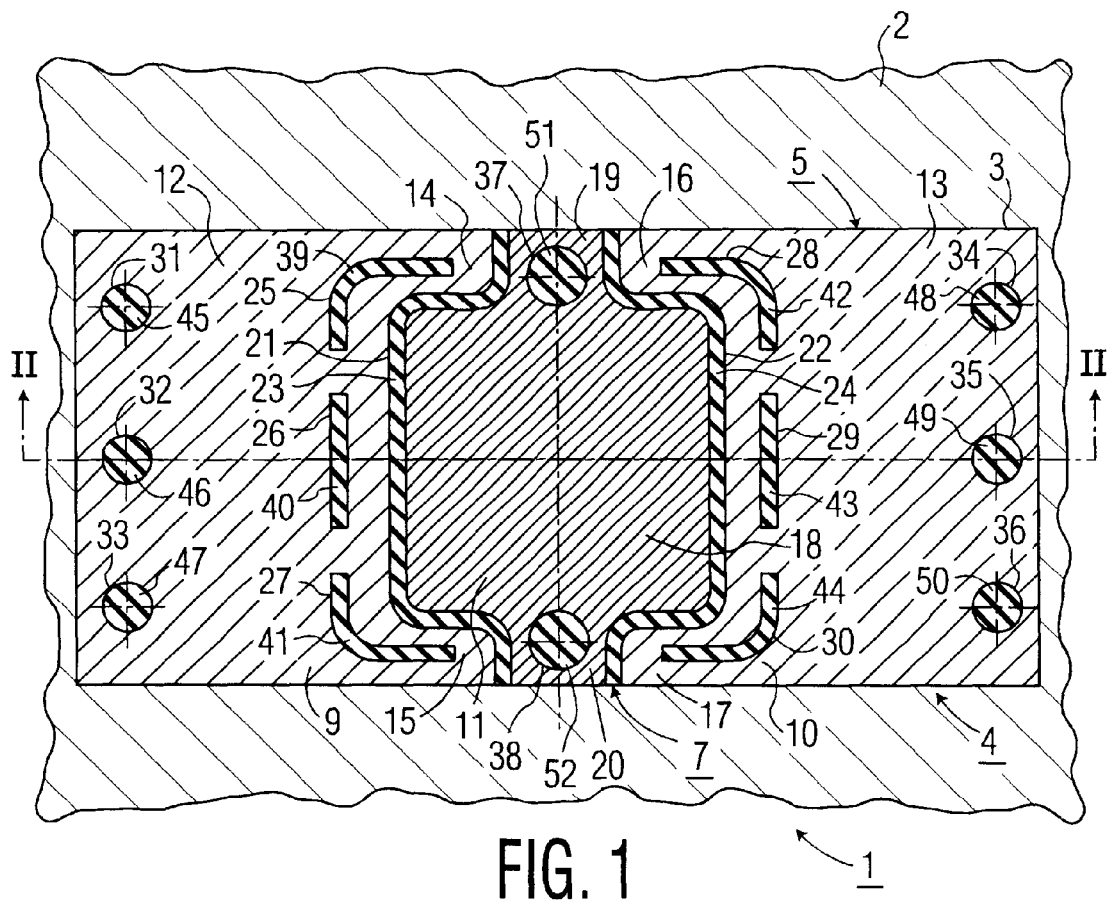
FIG. 1 shows a part of a data carrier in accordance with a first embodiment of the invention in a larger than full scale sectional view taken on the line I in FIG. 2.
Figure 2:
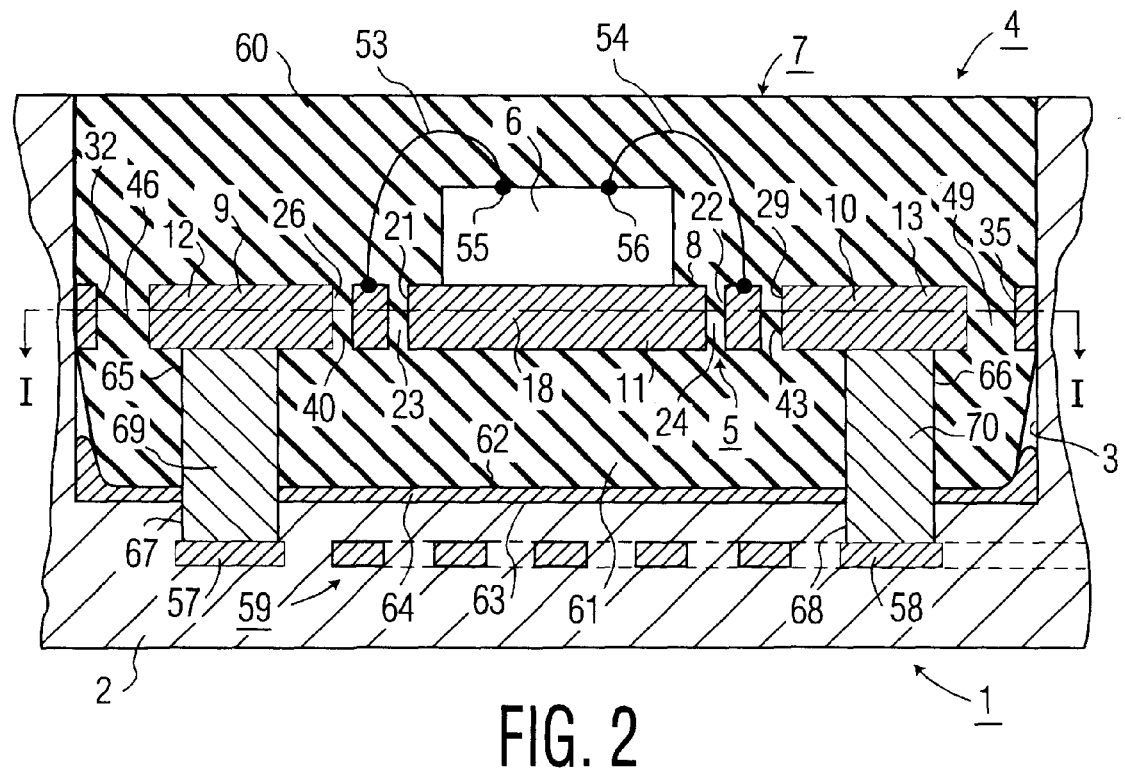
FIG. 2 shows the data carrier of FIG. 1 in a sectional view taken on the line II in FIG. 1.

FIGS. 1 and 2 shows a part of a data carrier 1, which in the present case takes the form of a so-called chip card and which is designed exclusively for the contactless communication with a write/read station.

The data carrier 1 has a carrier body 2, which in the present case has been formed from a plurality of plastic laminations with the aid of a lamination process, as already disclosed in the afore-mentioned document WO 97/05569 A1. The subject matter disclosed in the document WO 97/05569 A1 is incorporated herein by reference to this document. However, the carrier body 2 can alternatively be manufactured by means of an injection-molding process.

The carrier body 2 of the data carrier 1 has a trough-shaped recess 3. The data carrier 1 further comprises a module 4 implanted in the recess 3 after this recess 3 has been formed and electrically insulated with respect to the environment of the data carrier 1, as will be described in more detail hereinafter. The module 4 has further parts, namely a carrier/contact configuration 5, a chip 6, a chip cover 7 of an electrically insulating material which covers the chip 6, and two module contacts, which will also be described in more detail hereinafter.

As is apparent from FIG. 2, the carrier/contact configuration carries the chip 6 at its side 8 nearest the environment of the data carrier 1, the chip 6 being secured to the carrier/contact configuration 5 by means of an adhesive bond not shown in FIG. 2. The chip 6 is then embedded in the chip cover 7 which is made of a plastic and which is connected to the carrier/contact configuration 5.

In the data carrier 1 the carrier/contact configuration 5 of the module 4, which is implanted in the recess 3 after this has been formed, has been manufactured with the aid of a so-called metal lead frame, which consists of a conductive metal or a conductive metal alloy, namely a copper alloy. Among experts the use of such a metal lead frame is known per se for different other purposes. However, until now it has never been attempted to use such a metal lead frame for the manufacture of an implant module 4 or for the manufacture of a carrier/contact configuration 5 for such an implant module 4.

The carrier/contact configuration 5 of the module 4, which configuration has been manufactured with the aid of a metal lead frame, comprises two side parts 9 and 10 and a central part 11 which is substantially coplanar with the two side parts 9 and 10. Each of the two side parts 9 and 10 is U-shaped, each of the side parts 9 and 10 thus comprising a web portion 12 and 13, respectively, and two limb portions 14, 15 and 16, 17, respectively. The central part 11 has a shape adapted to the U-shape of the two side parts 9 and 10, in such a way that the central part 11 has a substantially rectangular central portion 18 and two peripheral portions 19 and 20 which project laterally from the central portion 18 and which are narrower than the central portion 18.

Between each of the two side parts 9 and 10 and the central part 11 a quadrangular separating zone 21 and 22 has been provided. Each separating zone 21 or 22 accommodates an identical quadrangular part 23 or 24 of the chip cover 7, as a result of which the two side parts 9 and 10 and the central part 11 are electrically insulated from one another.

Each of the two side parts 9 and 10 have slots 25, 26, 27, 28, 29 and 30 as well as holes 31, 32, 33, 34, 35 and 36. Furthermore, holes 37 and 38 have been provided in the peripheral portions 19 and 20 of the central part 11. Portions 39, 40, 41, 42, 43, 44, 45, 46, 47, 48, 49, 50, 51 and 52 of the chip cover 7 fit accurately in the slots 25, 26, 27, 28, 29 and 30, the holes 31, 32, 33, 34, 35 and 36, as well as the holes 37 and 38. The portions 39 to 52 are thus anchored in the two side parts 9 and 10 and in the central part 11, so that in this way the two side parts 9 and 10 and the central part 11 are mechanically connected to one another with the aid of the chip cover 7.

In the module 4 the central part 11 carries the chip 6. The two side parts 9 and 10 which are electrically insulated with respect to one another and with respect to the central part 11 directly form the module contacts of the module 4, which have already been mentioned briefly hereinbefore, which are each electrically connected to a respective one of the chip contacts 55 and 56, represented diagrammatically as a dot in FIG. 2, via a so-called bonding wire 53 or 54, respectively, and to a respective one of the coil contacts 57 and 58 of a transmission coil 59 for contactless communication in an inductive manner, which coil is embedded in the data carrier 1, i.e. in its carrier body 2.

In the data carrier 1, i.e. in the module 4 of the data carrier 1, as is shown in FIG. 2, the chip cover 7 is advantageously constructed as a double-sided cover in relation to the carrier/contact configuration 5 and comprises an outer part 60 situated nearer the environment of the data carrier 1 and an inner part 61 which is remoter from the environment of the data carrier 1. The outer part 60 and the inner part 61 are connected to one another via the portions 39 to 52 of the chip cover. The double-sided chip cover 7 is made of a plastic and has been manufactured simply and accurately by means of an injection-molding process.

In the present case the chip 6 is connected to the central part 11 at that side 8 of the central part 11 which is nearer the environment of the data carrier 1 and is thus covered by the outer part 60 of the chip cover 7. Furthermore, it is to be noted that the cross-sectional shape of the outer part 60 of the chip cover, taken perpendicularly to the depth direction of the trough-shaped recess 3, and the cross-sectional shape of the recess 3, taken perpendicularly to the depth direction of the recess 3, are substantially equal, so that the lateral surfaces of the outer part 60 of the chip cover 7 butts against the lateral bounding surfaces of the recess 3 and the recess 3 is thus sealed properly by means of the outer part 60 of the chip cover 7.

To secure the module 4 in the recess 3 an adhesive layer 64 has been provided between the innermost bounding surface 62 of the inner part 61 of the chip cover 7 and the bounding surface 63 at the bottom of the recess 3.

As is apparent from FIG. 2, the inner part 61 of the chip cover 7 has two passages 65 and 66, which each extend up to a side part forming a module contact 9 or 10, and the carrier body 2 has two entrances 67 and 68, which are disposed in line with the two passages 65 and 66 and which each extend up to a respective coil contact 57 or 58. The passages 65 and 66 and the entrances 67 and 68 are filled with an electrically conductive connection medium 69 and 70, preferably with an electrically conductive adhesive, the electrically conductive connection medium 69 and 70 being both mechanically and electrically connected to the side parts 9 and 10 forming the module contacts as well as to the coil contacts 57 and 58. The use of an electrically conductive adhesive as the connection medium 69 and 70 has the advantage that such an electrically conductive adhesive also contributes to the retention of the side parts 9 and 10 and, consequently, of the entire module 4.

An advantage obtained with the data carrier 1 shown in FIGS. 1 and 2 is that the carrier/contact configuration 5 requires only a comparatively small overall height because the side parts 9 and 10 and the central part 11 of the carrier/contact configuration 5 manufactured with the aid of a metal lead frame only have a thickness of approximately 80 Tm and, if desired, even less. This makes it possible to manufacture a module 4 having an overall height of only approximately 380 to 400 Tm, which is particularly advantageous for the production of very thin data carriers 1, particularly of very thin chip cards. A further advantage of the data carrier 1 is that the side parts 9 and 10 and the central part 11 made of a conductive metal or a conductive metal alloy, preferably a copper alloy, are comparatively flexible, so that even when the data carrier 1 is subjected to a comparatively large bending load the carrier/contact configuration 5 can deform elastically in accordance with the bending load exerted on the data carrier 1 without this having any adverse effects on the electrical connections between from the side parts 9 and 10 to the coil contacts 57 and 58. Another great advantage of the data carrier 1 is that the module 4 manufactured by means of a metal lead frame is substantially cheaper than a module manufactured by means of a so-called epoxy lead frame. The data carrier 1 has the advantage that no separate insulation means are required for the electrical insulation of the module 4 because the outer part 60 of the chip cover 7 is used for this purpose. By means of the passages 65 and 66 in the inner part 61 of the chip cover 7 an exact and proper electrically conductive connection is obtained between the module contacts 9 and 10 and the coil contacts 57 and 58.

The invention is not limited to the embodiment described hereinbefore by way of example. A carrier/contact configuration can alternatively have differently shaped side parts and a differently shaped central part. Moreover, the chip may be connected to the central part at that side of the central part which is remote from the environment of the data carrier, the outer part of the chip cover then merely serving to provide the electrical insulation of the module with respect to the environment of the data carrier.

What is claimed is:

1. A data carrier for contactless communication with a write/read station, the data carrier comprising:
   a carrier body;
   a trough-shaped recess in the carrier body;
   a module which has been implanted in the recess after it has been formed and which is electrically insulated with respect to an environment of the data carrier,
   which module comprises a carrier/contact configuration and a chip carried by the carrier/contact configuration and a chip cover of an electrically insulating material which covers the carrier/contact configuration, the chip and two module contacts comprised in the carrier/contact configuration,
   each module contact being electrically connected to both a chip contact of the chip and to a coil contact of a transmission coil embedded in the data carrier for the purpose of contactless communication,
   the carrier/contact configuration of the implanted module being a metal lead frame and comprising two side parts and a central part which is substantially coplanar with the two side parts and is situated between the two side parts,
   the two side parts and the central part being electrically insulated with respect to one another through the chip cover, and
   the two side parts forming the two module contacts and the central part carrying the chip, and
   the chip cover having a double sided construction in relation to the carrier/contact configuration and comprising a first part situated nearer the environment of the data carrier, a second part which is more remote from the environment of the data carrier and two passages,
   the module contacts and the coil contacts being electrically connected via the passages by means of an electrically conductive medium.

2. A data carrier as claimed in claim 1, the chip being connected to the central part at that side of the central part which is situated nearer the environment of the data carrier.

3. A data carrier as claimed in claim 1, a cross-sectional shape of the first part of the chip cover, taken perpendicularly to a depth direction of the trough-shaped recess, and a cross-sectional shape of the recess, taken perpendicularly to the depth direction, being substantially equal.

4. A data carrier as claimed in claim 1, wherein the electrically conductive medium is an electrically conductive adhesive.

5. A data carrier comprising:
   a chip having chip contacts;
   a transmission coil for contactless communication with a read/write station, the transmission coil having coil contacts;
   a metal lead frame comprising a chip carrying part for carrying the chip, a first contact forming part, and a second contact forming part, the chip carrying part and the first and second contact forming parts being arranged in a substantially coplanar relationship to each other, and the first and second contact forming parts being connected to the chip contacts and being electrically insulated from the chip carrying part;
   a chip cover made of electrically insulating material, with respect to the metal lead frame the chip cover being a double sided construction comprising a first cover part covering the chip at a first side of the metal lead frame and a second cover part covering a second side of the metal lead frame, the second cover part having electrically conducting passages connecting each of the first and second contact forming parts to a respective one of the coil contacts.

6. A data carrier as claimed in claim 5, wherein the metal lead frame, the chip and the chip cover form a module, and the data carrier has a pre-formed trough-shaped recess engaging the module.

7. A data carrier as claimed in claim 6, wherein the chip cover is an injection molded cover, the chip carrying part and first and second contact forming parts being mechanically coupled to each other through the injection molded cover.

8. A data carrier as claimed in claim 5, wherein the chip carrying part is a central part of the metal lead frame and the first and second contact forming parts are side parts of the metal lead frame.

9. A data carrier as claimed in claim 5, wherein the electrically conducting passages are filled with an electrically conductive adhesive.

* * * * *